United States Patent
Lee

(10) Patent No.: US 10,746,611 B2
(45) Date of Patent: Aug. 18, 2020

(54) MAGNETOSTRICTIVE STRAIN GAUGE SENSOR

(71) Applicant: Texas Instruments Incorporated, Dallas, TX (US)

(72) Inventor: Dok Won Lee, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 279 days.

(21) Appl. No.: 15/835,048

(22) Filed: Dec. 7, 2017

(65) Prior Publication Data

US 2019/0178730 A1   Jun. 13, 2019

(51) Int. Cl.
*G01L 1/12* (2006.01)
*G01B 7/24* (2006.01)
*H01L 41/12* (2006.01)

(52) U.S. Cl.
CPC ............. *G01L 1/125* (2013.01); *G01B 7/24* (2013.01); *H01L 41/125* (2013.01)

(58) Field of Classification Search
CPC .......... G01L 1/125; G01B 7/24; H01L 41/125
USPC ........................................................ 324/209
See application file for complete search history.

(56) References Cited

U.S. PATENT DOCUMENTS

| | | | | |
|---|---|---|---|---|
| 5,285,339 A * | 2/1994 | Chen | ................... | G11B 5/3903 360/327.1 |
| 5,667,879 A | 9/1997 | Haji-Sheikh | | |
| 2005/0199071 A1 * | 9/2005 | Ganapathi | ............... | B82Y 25/00 73/754 |
| 2007/0096839 A1 | 5/2007 | Meissner | | |
| 2013/0164777 A1 * | 6/2013 | Hayden | ................... | G01N 27/72 435/34 |
| 2013/0255393 A1 * | 10/2013 | Fukuzawa | ................. | G01L 1/12 73/779 |
| 2015/0185279 A1 * | 7/2015 | Milano | .............. | G01R 31/2884 324/750.3 |
| 2016/0009545 A1 * | 1/2016 | Fuji | ........................ | G01L 9/0042 257/419 |
| 2017/0167287 A1 * | 6/2017 | Jacobs | ....................... | G01L 3/04 |

(Continued)

OTHER PUBLICATIONS

McGuire et al.; "Anisotropic Magnetoresistance in Ferromagnetic 3d Alloys"; Pub. Date Jul. 1975; IEEE Transactions on Magnetics, vol. MAG-11, No. 4 (Year: 1975).*

(Continued)

*Primary Examiner* — Melissa J Koval
*Assistant Examiner* — Rahul Maini
(74) *Attorney, Agent, or Firm* — Rose Alyssa Keagy; Charles A. Brill; Frank D. Cimino

(57) ABSTRACT

A strain gauge sensor includes a substrate, at least one resistor comprising a magnetoresistive material on the substrate. The magnetoresistive material exhibits a magnetostriction coefficient $\lambda$ that is greater than or equal to ($\geq$) |2| parts per million (ppm) and an anisotropic magnetoresistance effect with an anisotropic magnetoresistance of greater than or equal to ($\geq$) 2% $\Delta$ R/R. The strain gauge sensor consists of a single layer of the magnetoresistive material. At least a first contact to the resistor provides a sensor input and a second contact to the resistor provides a sensor output.

22 Claims, 6 Drawing Sheets

(56) References Cited

U.S. PATENT DOCUMENTS

2017/0261306 A1* 9/2017 Ausserlechner ......... G01B 7/18

OTHER PUBLICATIONS

Morten et al.; "Magnetoresistive thick film sensor for linear displacements"; Pub. Date 1995; Sensors and Actuators; A 46-47; 261-265 (Year: 1995).*
Morten et al.; "Magnetoresistive properties of Ni-based thick films"; Pub. Date 1990; Journal of Materials Science; Materials in Electronics 1; 118-122 (Year: 1990).*
M. Löhndorf, et al., "Strain Sensors Based on Magnetostrictive GMR/TMR Structures", IEEE Transactions on Magnetics, vol. 38, No. 5, Sep. 2002, pp. 2826-2828.

* cited by examiner

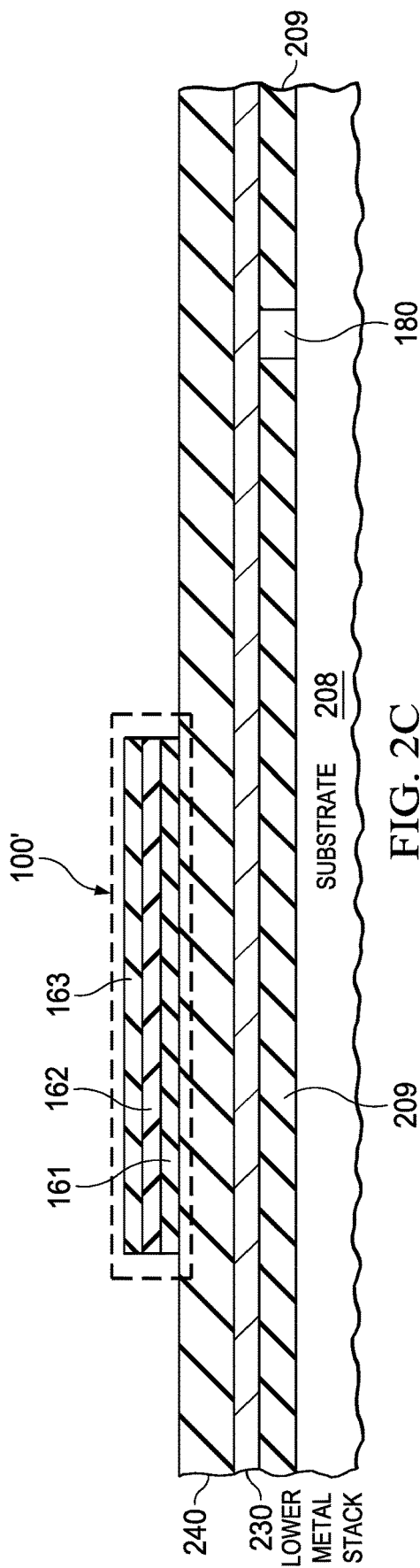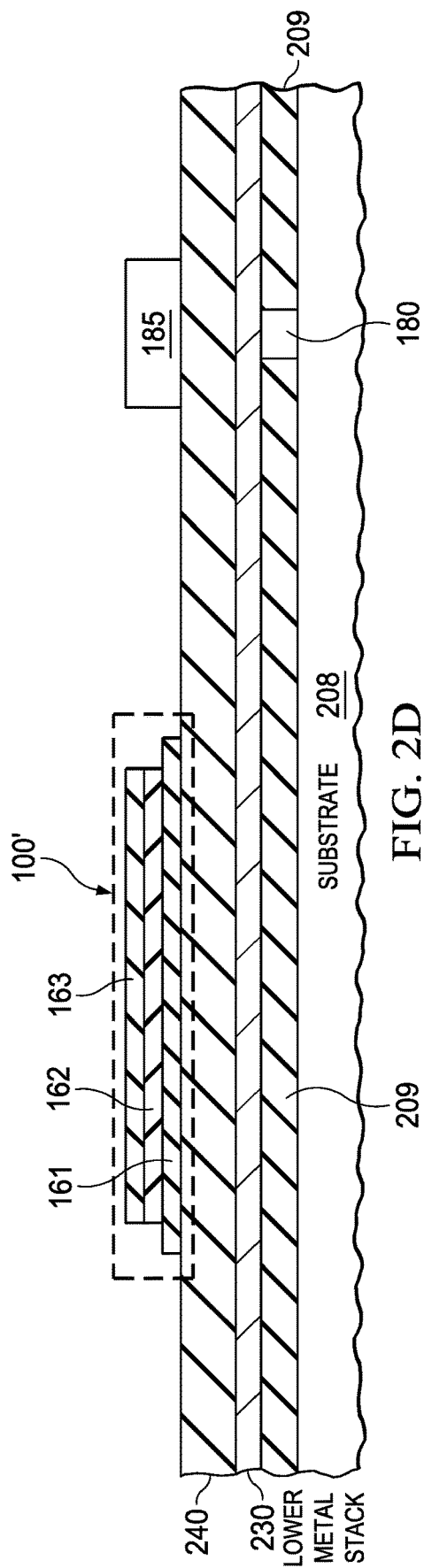

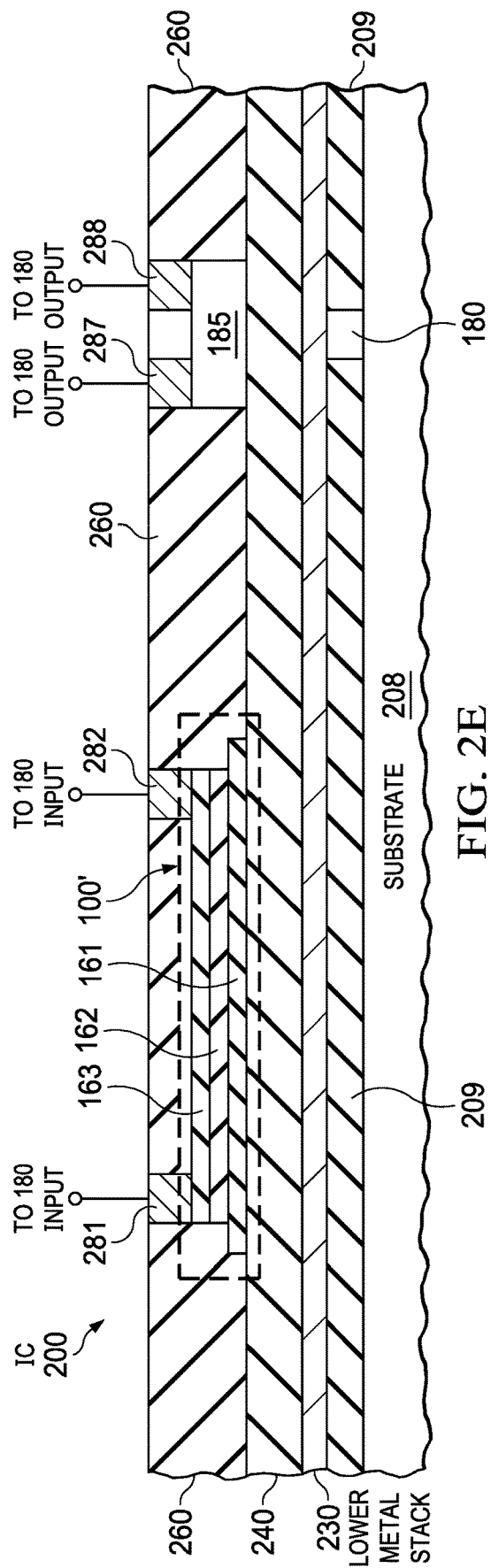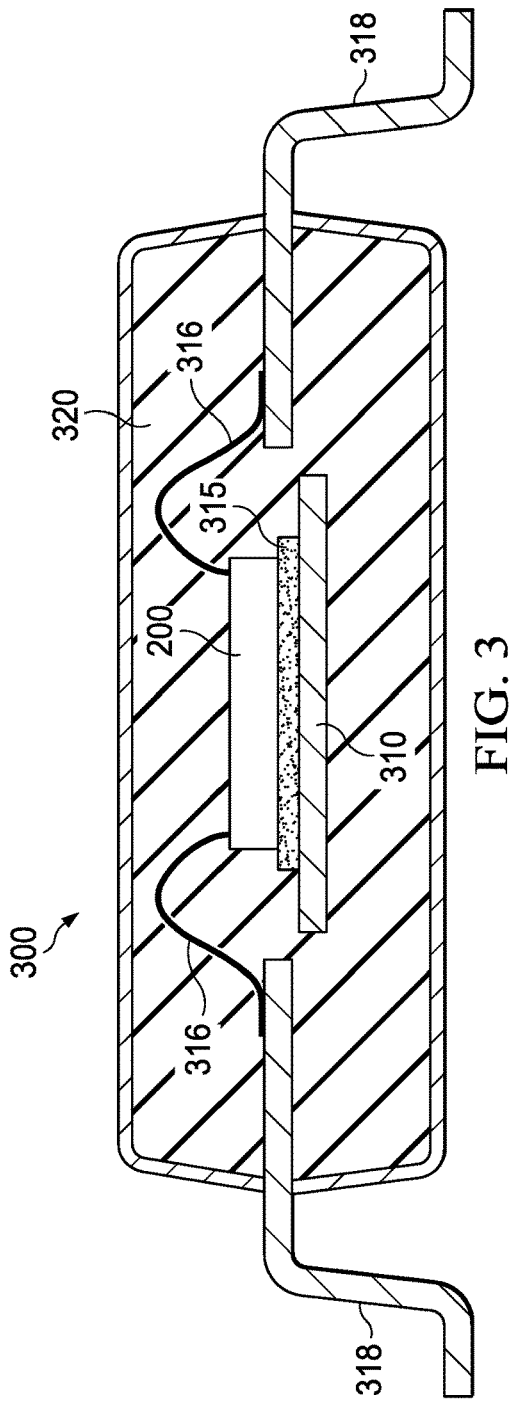

MAGNETOSTRICTIVE STRAIN GAUGE SENSOR

FIELD

This Disclosure relates to strain gauge sensors.

BACKGROUND

The magnetoresistive effect is the change of electrical resistivity of a magnetoresistive (MR) material due to the presence of a magnetic field and anisotropic magnetoresistance (AMR) sensors comprise a MR material that sense the AMR effect. Magnetoresistance is expressed as a change in resistance $\Delta R$ due to the magnetization divided by the nominal resistance R. AR is a function of the angle between the magnetization and current direction flowing in the MR material.

The AMR sensors comprise a thin MR film. For example permalloy is about 80% Ni and 20% Fe, or a permalloy 80 film is roughly 80% nickel, 15% iron, and 5% molybdenum. As used herein, %'s of materials are all weight percentages. There is a hard axis with a high requirement of magnetization energy in one direction in the plane of the magnetic film, and orthogonal to the hard axis in the plane of the film is an easy axis which indicates the magnetic preference direction. AMR sensors offer robust non-contact measurement of changes in the magnetic field as seen by the sensor, where the AMR sensor can detect the presence, the strength, and/or the direction of the magnetic field.

In typical AMR sensor applications, MR materials are ferromagnetic materials such as nickel iron (NiFe) which have top side electrical connections that are used to detect the component of a magnetic field that lies in the plane of the MR material. In some applications, the MR material is disposed in a serpentine array on the surface of a substrate such as silicon. The serpentine pattern of MR material can be electrically connected in a Wheatstone bridge arrangement (4 resistors) or a pair of Wheatstone bridges in order to sense changes in the resistance of the MR material resistors in response to changes in the strength of a magnetic field component in the plane of the MR elements. In order to monitor the changes in the resistance of the MR material resistors, associated components such as amplifiers that are on the same chip are generally connected together to form an electrical circuit which provides an output signal that is representative of the strength of the magnetic field in the plane of the MR sensing element resistors.

Designers of AMR sensors purposely select MR materials that have a magnetostriction that is as low as possible, because the magnetostriction effect can change the measured resistance leading to sensing errors. The exact composition of the MR material alloy may be selected to try to obtain a 0 value for magnetostriction, such as about 81.5% Ni. For example, a conventional permalloy film (about 20% Fe and 80% Ni) although having a relatively high magnetoresistance value, generally has a magnetostriction coefficient ($\lambda$) that is <<1 per million (ppm).

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include strain gauge sensors comprising a substrate, at least one resistor comprising a magnetoresistive material on the substrate. The magnetoresistive material exhibits a $\lambda$ value that is $\geq |2|$ parts ppm and also exhibits an AMR effect with an anisotropic magnetoresistance of $\geq 2\% \, \Delta R/R$. Conventional AMR materials such as permalloy as described above have a $\lambda$ value of <<1 ppm that is recognized to not be suitable for use as a strain gauge sensor. The strain gauge sensor consists of a single layer of the magnetoresistive material.

The strain gauge sensor includes at least a first contact to the resistor to provide a sensor input and a second contact to the resistor provide a sensor output. The strain gauge sensor can comprise first, second, third and fourth resistors electrically connected in a Wheatstone bridge architecture. Also disclosed are ICs including packaged ICs comprising a strain gauge sensor for sensing a strain applied to the IC which is sensed by the strain gauge sensor by its resulting change in magnetoresistance which changes the electrical resistance of the stain gauge sensor, that is coupled to compensation circuitry which generates a compensating signal that compensates a sensor or resonator on the same IC for strain-induced shifts in its output parameter.

BRIEF DESCRIPTION OF THE DRAWINGS

Reference will now be made to the accompanying drawings, which are not necessarily drawn to scale, wherein:

FIGS. 2A-E are cross-sectional diagrams showing processing progression for an example method of forming an IC including a disclosed strain gauge sensor for sensing a strain applied to the IC by its resulting change in magnetoresistance which changes the electrical resistance of the sensor, that is coupled to compensation circuitry which generates a compensating signal that compensates a sensor or resonator on the IC for strain-induced shifts in its output parameter, according to an example aspect.

FIG. 3 is a cross sectional view of an IC including a disclosed strain gauge sensor that is coupled to compensation circuitry which generates a compensating signal that compensates a sensor or resonator on the IC for strain-induced shifts in its output parameter, shown as the IC in FIG. 2E, to provide a packaged IC.

DETAILED DESCRIPTION

Figure 1A:
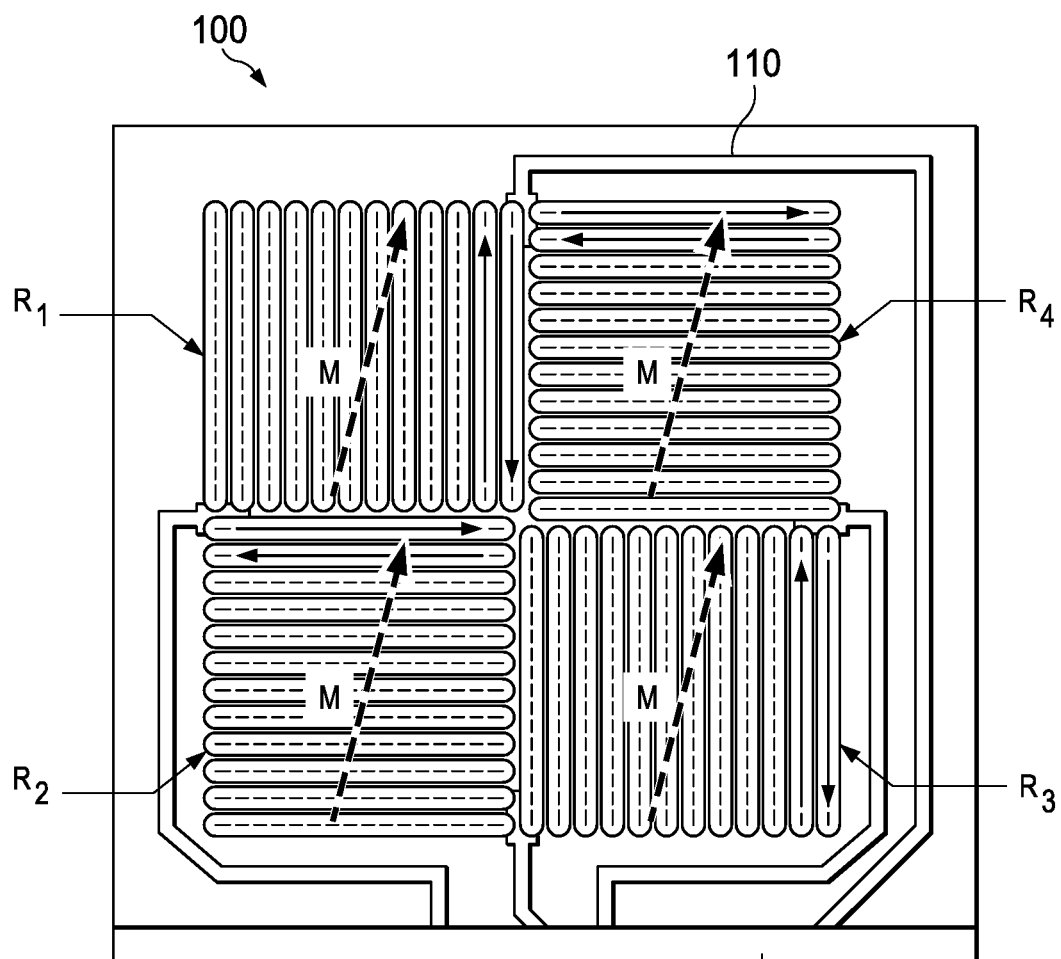
FIG. 1A is a top view depiction of a magnetostrictive strain gauge sensor configured as a Wheatstone bridge comprising 4 resistors made of a magnetostrictive material layer.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize some IC-based products are sensitive to the stress or strain that can be generated during the IC processing or its assembly packaging. Stress is defined as the resisting force per unit area, while strain is defined as the material deformation per unit area, as a length ratio ΔL/L. Stress and strain are thus known to be related to each other by a constant called Young's Modulus (or the elastic modulus) which varies depending on the material, so that strain will be used herein although stress could also have been used.

For example, for a Bulk Acoustic Wave (BAW) resonator device, its resonant frequency can be used as a clock on the IC, where the clock may experience a frequency shift due strain which can vary significantly, particularly for a packaged IC. A BAW resonator comprises a piezoelectric material sandwiched between two electrodes and acoustically isolated from the surrounding medium, where the strain-induced shift in resonant frequency can result in a clocking error. It is recognized herein to thus be desirable to have an on-chip strain sensor to measure the strain to enable compensating circuitry on the chip to provide a compensation signal for compensating for the strain's impact on the output parameter of the sensor or resonator on the IC.

Known integrated strain gauge sensors include semiconductor strain gauges based on the piezoresistive effect which are currently in production and magneto strictive strain gauges based on the magnetostrictive effect that are currently in research. Semiconductor strain gauges have a high gauge factor (GF) of ~100, and can be integrated on semiconductor ICs. As known in the art, the GF (or strain factor) is a figure of merit of a strain gauge which is the ratio of relative change in electrical resistance ΔR (caused by the strain)/R (undeformed, i.e., no strain), to the applied mechanical strain (ε). However, the semiconductor strain gauges performance can be adversely affected by the temperature dependence of the resistance. Magnetostrictive strain gauges have a transformer architecture, and provide an output signal that reflects a change in magnetic permeability, so that they thus have a temperature dependence in the permeability. The process to form integrated magnetostrictive strain gauges is also complex. Metallic strain gauges are not sensitive to the strain (i.e. low GF ~2), and are not suitable for the measurement of a localized strain.

Disclosed strain gauge sensors are based on recognizing that a sensitive strain gauge sensor can be realized using a magnetostrictive material that has both a relatively high magnetoresistance (thus a high output signal) being ≥2% Δ R/R, and a relatively high magnetostriction so that the stress being applied can be determined from measuring the change in electrical resistance. The strain gauge sensor consists of a single layer of the magnetoresistive material. The magnetostrictive material has a Δ that is greater than or equal (≥) |2| ppm, that typically ranges between 2 ppm and 100 ppm, which can be either positive or negative.

Disclosed strain gauge sensors are distinct from giant magnetoresistive (GMR) and tunneling magnetoresistive (TMR) sensors which involve effects which cannot be obtained from a single magnetic layer. Moreover, GMR and TMR sensors each require the respective magnetic layers to be being different to operate, where GMR and TMR effects use the angle difference between the magnetizations of the two magnetic layers.

One class of magnetostrictive materials that can be used for disclosed strain gauge sensors is a Ni—Fe alloy with Ni richer (higher %) than permalloy, and one particular example Ni—Fe alloy material is Ni 85-90%/Fe10-15% alloy (as noted above all %'s herein are weight percentages) that has a λ~−10 ppm (much higher than permalloy) and a magnetoresistance ~5%. Other magnetostrictive materials that can be used include materials having high magnetostriction and high magnetoresistance (other than Ni 85% to 90%, Fe 10% to15%) comprise Ni that has a λ ~−34 ppm and magnetoresistance ~2%, and a Ni 90% Co 10% alloy that has a λ~−30 ppm and magnetoresistance ~5%. Disclosed strain gauge sensors can also use other magnetostrictive materials. The thickness of the magnetostrictive material layer can be generally be between 10 nm and 1,000 nm.

In addition, configuring the strain gauge sensor in the optional Wheatstone bridge configuration can essentially remove the temperature dependence of the resistance. (see FIGS. 1A and 1B described below). While there is still a temperature dependence of magnetoresistance, the temperature dependence of magnetoresistance is less sensitive as compared to the temperature dependence of resistance. Moreover, as described below, the temperature dependence of the output voltage can be further suppressed by biasing the Wheatstone bridge using applied current instead of the conventional voltage biasing of a Wheatstone bridge.

Disclosed aspects include stand-alone magnetostrictive material-based strain gauge sensors and integrated strain gauge sensors that are integrated with other sensors or resonators together with strain compensation circuitry the same IC. By measuring the change in electrical resistance for a disclosed strain gauge sensor, such as in the Wheatstone bridge configuration which can remove the temperature dependence of resistance, the applied strain can be determined. For example, the ΔR value can be converted to a strain value using a look-up table having empirical data for the particular magnetostrictive material. There is no need for a conventional external magnetic field to be applied to measure the change in magnetic permeability because the change in electrical resistance is instead used to detect the strain being applied.

Figure 1B:
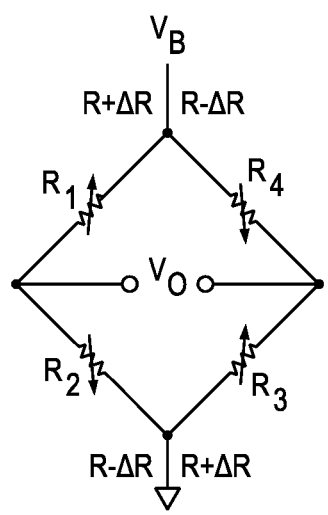
FIG. 1B shows the equivalent circuit for the strain gauge sensor in FIG. 1A showing the output from the Wheatstone bridge as an output voltage (Vo).

FIG. 1A shows a top view depiction of a magnetostrictive strain gauge sensor 100 formed on a substrate 208 configured as a Wheatstone bridge comprising 4 resistors shown as $R_1$, $R_2$, $R_3$ and $R_4$ each made of a magnetostrictive material layer which is also magnetoresistive, and FIG. 1B shows the equivalent circuit of the strain sensor showing the output from the bridge as Vo. The magnetoresistive material resistors will typically be in a Wheatstone bridge arrangement. The bridge resistor elements change their resistance when a magnetic field (M) is applied across the die with thin films of magnetostrictive/magneto-resistive material, generally 10 nm to 1,000 nm thick, which forms the resistors $R_1$-$R_4$. The resistors $R_1$, $R_2$, $R_3$ and $R_4$ are all shown comprising a plurality of spaced apart magnetoresistive material strips. Each of the strips are spaced apart from one another and are electrically connected to one another in series, generally by metal. Strips are typically used because they provide good control of the current flow direction.

The connection lines shown in FIG. 1A such as 110 that contact the various nodes on the resistors of the Wheatstone bridge on the equivalent circuit are generally metal traces. As shown in FIG. 1B, $R_1$ and $R_3$ increase in resistance (shown as R+ΔR) due to their angle (θ) of their current direction flowing in the magnetostrictive/magnetoresistive material relative to the applied M with an example orientation shown in FIG. 1A, and $R_2$ and $R_4$ decrease in resistance (shown as R−ΔR) due to their angle (θ) relative to the applied M. A bias voltage from a power supply shown as $V_B$ in FIG. 1B is applied to the top node, and Vout shown as Vo is sensed and used in the equation below, where for the resistors R is the resistance, ΔR is the change in R due to M, and the magnetoresistance (shown below as MR' because MR is used herein as the magnetoresistive material) is a function of the angle of M relative to the resistors being cos 2θ:

$$V_O=(\Delta R/R)V_B=(V_B/2)MR' \cos 2\theta$$

There is no Vo dependence on resistance for the resistors in the $V_O$ equation above. Alternatively, the $V_O$ measurement can be current-based, where the applied current is shown $I_B$.

$$V_O=(\Delta R/R)I_BR=(I_B/2)R(T)MR'(T)\cos 2\theta$$

Here T is the temperature, and R(T) is seen to increase with increasing T, and MR'(T) is seen to decreasing as T increases, which makes the $V_O$ measurement from the bridge using current bias to be temperature compensated.

Functional circuitry on the IC can apply a voltage onto the Wheatstone bridge or serve as a current source to apply a current instead. Output circuitry coupled to the Wheatstone bridge voltage output can include a low noise amplifier (LNA) with low noise attributes to amplify a $V_O$ sensor output signal that is generally at a level of about 20 μV or less. In addition the Wheatstone bridge can have some voltage offset as the resistors are generally not perfectly matched.

FIGS. 2A-E are cross-sectional diagrams showing a process progression for an example method of forming an IC 200 (IC 200 shown in FIG. 2E) including a disclosed strain gauge sensor 100' and a sensor or resonator device 185 that has its strain compensated for by compensation circuitry 180 from data received from the strain gauge sensor 100' used for the compensation, according to an example aspect. The process described is a thin-film-resistor (TFR)-like process to form the strain gauge sensor device 100' so that there are only minimal changes to an existing semiconductor process flow utilized to form ICs, which is generally a complementary metal-oxide-semiconductor (CMOS) process.

Figure 2A:
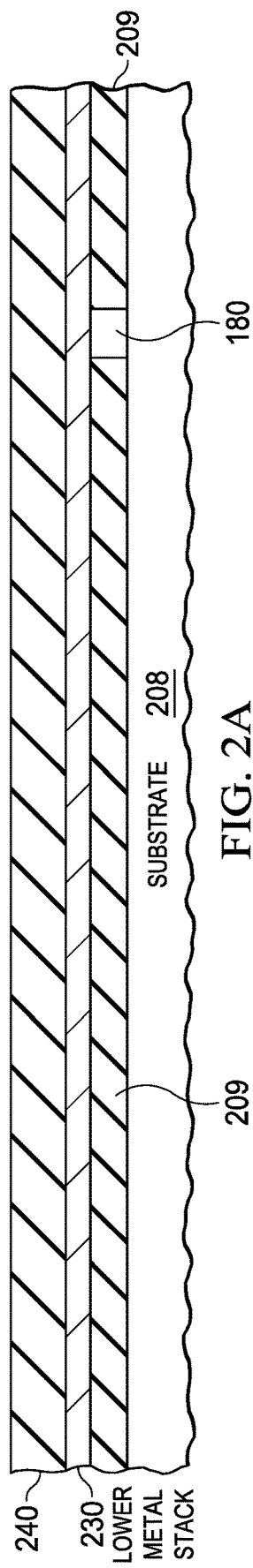

FIG. 2A shows a substrate 208 having at least a semiconductor surface layer 209 (e.g., an epitaxial layer) where the compensation circuitry 180 which comprises a plurality of transistors formed in the semiconductor surface layer 209 shown as a block was formed. The substrate 208 and/or semiconductor surface layer 209 can comprise silicon, silicon-germanium, or other semiconductor material.

The compensation circuitry 180 generally comprises amplifiers, filters, comparators, and a look-up table or digital calculation logic all formed in the semiconductor surface layer 209 that provides a relation between the strain and the output parameter of a sensor or resonator device (see sensor or resonator device 185 shown in FIG. 2D) on the IC to be strain compensated. There is a lower metal stack 230 on the semiconductor surface layer 209, and an interlevel dielectric (ILD) layer 240 on the lower metal stack 230.

Figure 2B:
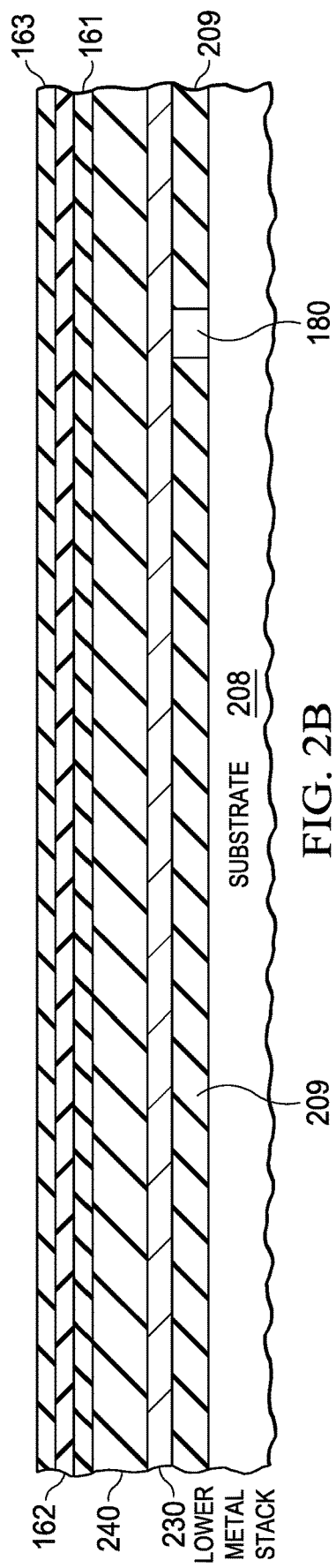

FIG. 2B shows the in-process IC after the deposition of the respective layers to later form the patterned strain gauge sensor 100' (161, 162, 163) on the ILD layer 240. The strain gauge sensor generally comprises a layer stack that is deposited beginning with a seed layer 161, then a magnetostrictive material layer 162, then a capping layer 163. The layers 161 to 163 can be deposited in one deposition system without breaking vacuum. In another aspect the seed layer 161 can be deposited in a first deposition tool and then be moved to a second deposition tool for depositing the magnetostrictive material layer 162 and the capping layer 163. In this other aspect before the magnetostrictive material layer 162 is deposited a pre-sputter etch can be used to etch the surface of the seed layer 161 to remove any oxide layer that may have formed.

The seed layer 161 provides a seed for the magnetostrictive material layer 162 such as $Ni_{88\%} Fe_{12\%}$ to promote its adhesion and to avoid diffusion. The capping layer 163 can comprise a dielectric material, such as aluminum nitride (AlN). The capping layer 163 can also comprise an electrically conductive material, such as Ta or tantalum nitride (TaN).

In one aspect the seed layer 161 comprises a TaN layer. The seed layer 161 can also comprise Ta, Jr, Mn, Ti or SiN. The thickness of seed layer 161 can be 50 A to 300 A, such as 100 A of sputtered TaN which as described above can get sputter etched before depositing the magnetostrictive material layer 162 to a lower thickness value of around 60 A. In one particular aspect the seed layer 161 comprises TaN, the magnetostrictive material layer 162 comprises Ni 85-90%/Fe 10-15%, and the capping layer 163 comprises AlN.

The sensor stack is then patterned (lithography then etching) to provide the strain gauge sensor 100' with the after etched result shown in FIG. 2C. One aspect is a single step patterning and etching for all layers 163, 162, 161 of the sensor stack. In another aspect a mask is used to dry (or wet) etch the seed layer 161 first. This seed layer mask can be a bit larger (e.g., ≥0.1 μm) than the magnetostrictive material layer 162 mask (which also etches the capping layer 163) to provide a small (e.g., 0.2 μm) extension of the seed layer 161 out from the magnetostrictive material layer 162. The magnetostrictive material layer 162 and capping layer 163 can then be wet etched together, or dry etched together. The sensor stack can be connected electrically in a Wheatstone bridge arrangement.

FIG. 2D shows the in-process IC after forming the sensor or resonator device 185 that has its strain compensated for by compensation circuitry 180. In one aspect the sensor or resonator device 185 comprises a BAW resonator device. Although not shown, there are vias for contacting nodes on the compensation circuitry 180. Moreover, the sensor or resonator device 185 can be formed first, and can be below or above the strain gauge 100'.

FIG. 2E shows the in-process IC after depositing another ILD layer 260 and forming a top metal layer including contact pads 281, 282 for contacting the strain gauge sensor 100' coupled to coupling traces (not shown) that couple the contacts of the strain gauge sensor 100' to inputs of the compensating circuitry 180. The top metal layer also couples the output of the compensating circuitry 180 to contact pads 287, 288 that contact an input of the sensor or resonator device 185. The top metal layer can comprise aluminum (or aluminum alloy) or copper. Passivation overcoat (PO) then generally follows, followed by patterning the PO. The PO layer comprises a dielectric layer such as silicon oxide, silicon nitride or SiON.

FIG. 3 is a cross sectional view of a disclosed packaged IC 300 including a disclosed strain gauge sensor that is coupled to compensation circuitry which generates a compensating signal that compensates a sensor or resonator on the IC for strain-induced shifts in its output parameter, shown as IC 200 that is also shown in FIG. 2E, that can be in a plastic Small Outline Integrated Circuit (SOIC) or Quad Flat Package (QFP) package. Packaged IC 300 has the IC 200 attached to a leadframe die pad 310 by a die attach material 315. Bond wires 316 are shown bonding bond pads on the IC 200 to leads 318 of the leadframe shown encapsulated by an epoxy mold compound 320.

One can minimize other magnetic anisotropies for the strain gauge sensor so that the strain alone can lead to the change in the magnetoresistance properties of the magnetoresistive material. For example, the spacing between magnetoresistive material strips can be ≤2 µm, and the width of strips can be wider to reduce the overall shape anisotropy, such as ≥10 µm. Magnetic alignment can be avoided during the strain gauge sensor fabrication to reduce the induced as-deposited magnetocrystalline anisotropy by turning off the current to electromagnet during the deposition of the magnetostrictive material.

EXAMPLES

Disclosed aspects are further illustrated by the following specific Examples, which should not be construed as limiting the scope or content of this Disclosure in any way.

Figure 4A:
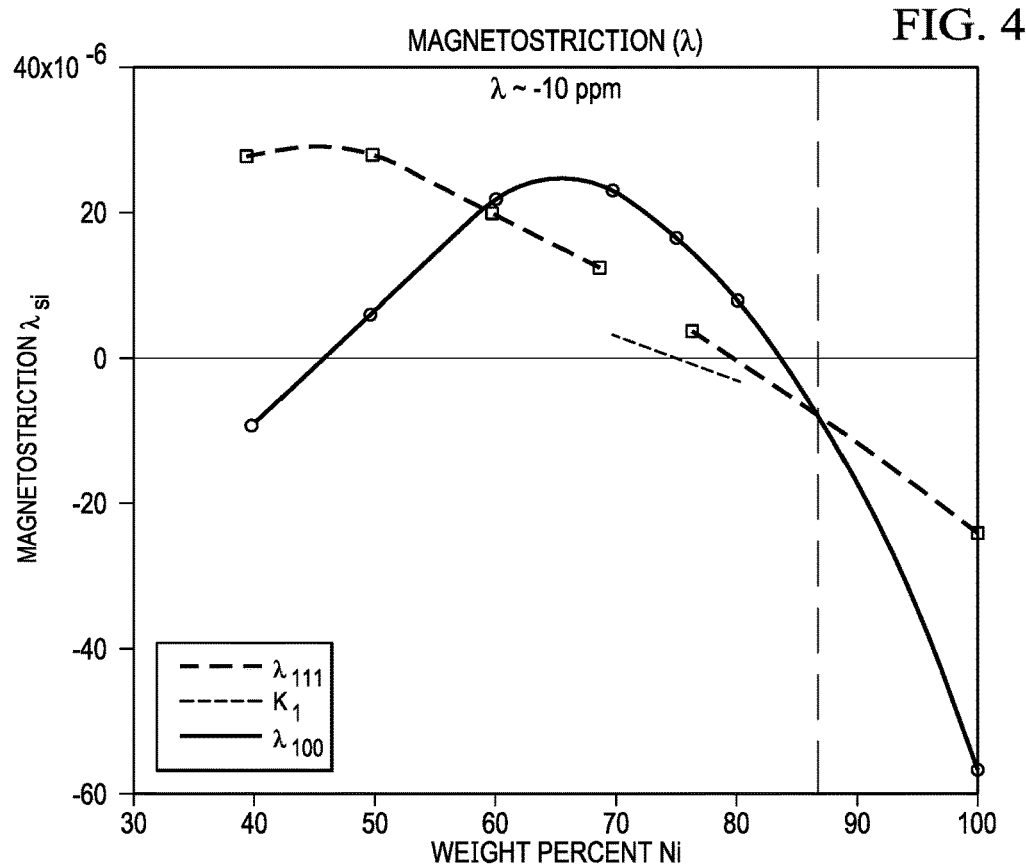
FIGS. 4A, B and C shows the $\lambda$, magnetoresistance and (magnetocrystalline anisotropy) $K_1$ values for one possible magnetostrictive material for disclosed strain gauge sensors shown for a $Ni_{85 \, to \, 90\%} Fe_{10 \, to \, 15\%}$ alloy.
Figure 4B:
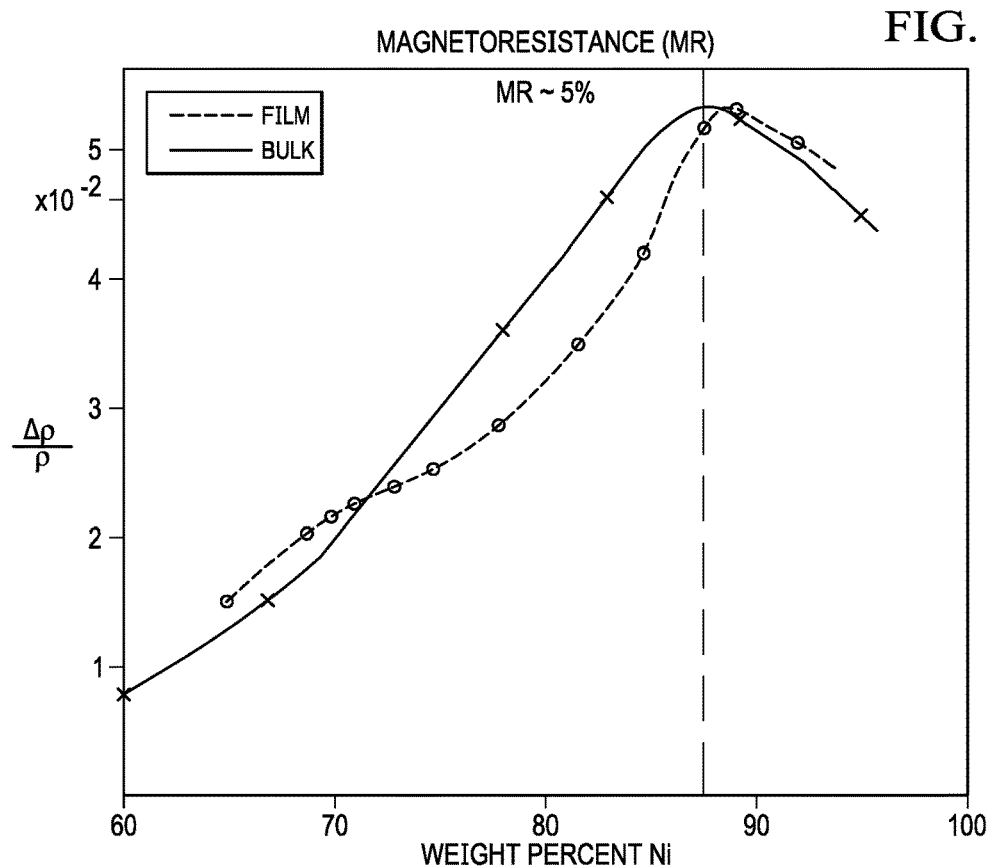
Figure 4C:
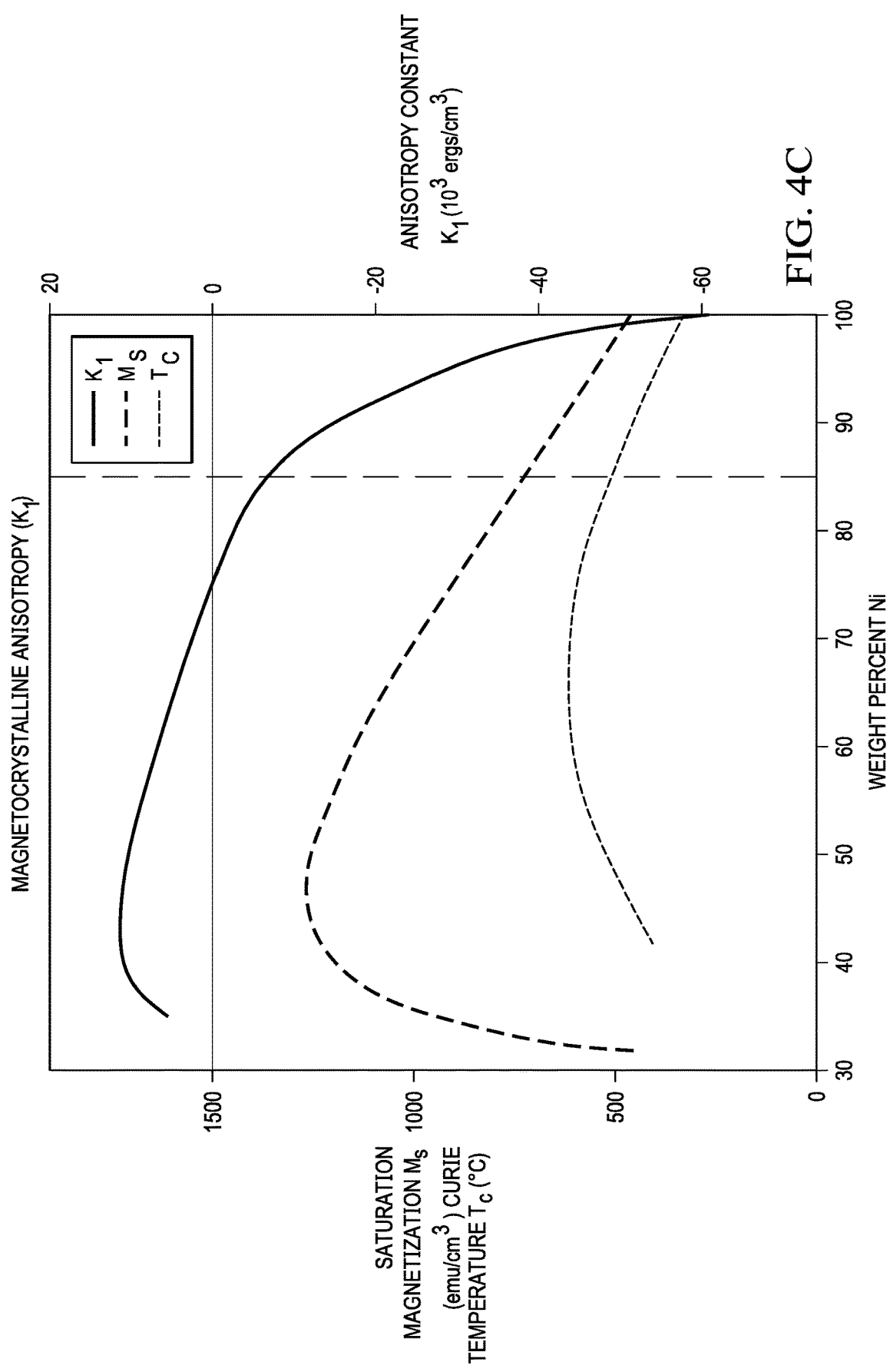

A magnetic material with low magnetocrystalline anisotropy as described above should generally be used to reduce the magnetocrystalline anisotropy. A disclosed example material is a Ni 85-90%/Fe 10-15% alloy described in this Example. For this material as shown by the vertical dashed lines in FIGS. 4A, 4B and 4C, λ is about −10 ppm, MR' is about 5% and the $K_1$ is about $-10 \times 10^3$ ergs/cm$^3$. The GF for this material is about 80. For known permalloy (about 80% Ni, balance Fe), λ can be seen to be very close to zero, rendering it useless for strain gauge sensing.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other aspects and variations of disclosed aspects are possible within the scope of the claimed invention, and further additions, deletions, substitutions and modifications may be made to the described embodiments without departing from the scope of this Disclosure.

The invention claimed is:

1. A strain gauge sensor, comprising:
   a substrate;
   at least one resistor comprising a magnetoresistive material on said substrate, said magnetoresistive material exhibiting a magnetostriction coefficient λ that is greater than or equal to (≥) |2| parts per million (ppm) and an anisotropic magnetoresistance effect with an anisotropic magnetoresistance of greater than or equal to (≥) 2% ΔR/R, wherein said strain gauge sensor consists of a single layer of said magnetoresistive material, and
   at least a first contact to said resistor to provide a sensor input and a second contact to said resistor provide a sensor output.

2. The strain gauge sensor of claim 1, wherein said λ is greater than or equal to (≥) |5| ppm.

3. The strain gauge sensor of claim 1, wherein said magnetostrictive material comprises a Ni—Fe alloy comprising Ni 85 to 90 weight % and Fe 10 to 15% weight %.

4. The strain gauge sensor of claim 1, wherein said magnetostrictive material comprises Ni or a Ni alloy.

5. The strain gauge sensor of claim 1, wherein said magnetoresistive material has a thickness of 10 nm to 1,000 nm.

6. The strain gauge sensor of claim 1, wherein said at least one resistor comprises first, second, third and fourth said resistors electrically connected in a Wheatstone bridge architecture, wherein each said first, second, third and fourth resistor comprise a plurality of spaced apart strips.

7. The strain gauge sensor of claim 6, wherein a spacing between said plurality of strips is less than or equal to (≤) 2 µm, and wherein a width of said plurality of strips is greater than or equal to (≥) 10 µm.

8. The strain gauge sensor of claim 1, wherein said substrate includes at least a semiconductor surface, further comprising another sensing device or resonator on said semiconductor surface coupled to said strain gauge sensor by compensation circuitry.

9. The strain gauge sensor of claim 8, wherein said another sensing device comprises a bulk acoustic wave (BAW) resonator device.

10. A method of forming an integrated circuit, comprising:
    providing a substrate; and
    forming a strain gauge sensor on the substrate by:
      forming at least one resistor comprising a patterned magnetostrictive material on said substrate (resistor), said magnetoresistive material exhibiting a magnetostriction coefficient A that is greater than or equal to (≥) |2| parts per million (ppm) and an anisotropic magnetoresistance effect with an anisotropic magnetoresistance of greater than or equal to (≥) 2% ΔR/R, wherein said strain gauge sensor consists of single layer of said magnetoresistive material, and
      forming at least a first contact to said resistor to provide a sensor input and a second contact to said resistor provide a sensor output.

11. The method of claim 10, wherein said λ is greater than or equal to (≥) |5| ppm.

12. The method of claim 10, wherein said magnetostrictive material comprises a Ni—Fe alloy comprising Ni 85 to 90 weight % and Fe 10 to 15 weight %.

13. The method of claim 10, wherein said at least one resistor comprises first, second, third and fourth said resistors electrically connected in a Wheatstone bridge architecture, wherein each said resistor comprise a plurality of spaced apart strips.

14. The method of claim 10, wherein said substrate includes at least a semiconductor surface, further comprising another sensing device or resonator on said semiconductor surface coupled to said strain gauge sensor by compensation circuitry.

15. The method of claim 10, wherein said method is exclusive of magnetic alignment including turning off a current to an electromagnet during a deposition of said magnetostrictive material.

16. A strain compensated integrated circuit (IC), comprising:
    a substrate comprising at least a semiconductor surface;
    a strain gauge sensor on said semiconductor surface for sensing a strain applied to the IC, comprising:
      at least one resistor comprising a magnetoresistive material, said magnetoresistive material exhibiting a magnetostriction coefficient A that is greater than or equal to (≥) |2| parts per million (ppm) and an anisotropic magnetoresistance effect with an anisotropic magnetoresistance of greater than or equal to (≥) 2% ΔR/R, wherein said strain gauge sensor consists of a single layer of said magnetoresistive material, and at least a first contact to said resistor to provide a sensor input and a second contact to said resistor provide a sensor output;

said sensor input and said sensor output coupled to compensation circuitry which compensates a second strain sensor or a resonator on said IC for strain-induced shifts in its output parameter.

17. The IC of claim 16, wherein said at least one resistor comprises first, second, third and fourth said resistors electrically connected in a Wheatstone bridge architecture, wherein each said resistor comprise a plurality of spaced apart strips.

18. The IC of claim 17, wherein a spacing between said plurality of strips is less than or equal to (≤) 2 μm, and a width of said plurality of strips is greater than or equal to (≥) 10 μm.

19. The IC of claim 16, wherein said second strain sensor or resonator device comprises a bulk acoustic wave (BAW) resonator device and wherein said compensation circuitry provides frequency compensation.

20. The IC of claim 16, further comprising a package, wherein said IC is within said package.

21. The IC of claim 16, wherein said λ is greater than or equal to (≥) |5| ppm.

22. The IC of claim 16, wherein said magnetostrictive material comprises a Ni—Fe alloy comprising Ni 85 to 90 weight % and Fe 10 to 15 weight %.

* * * * *